(12) United States Patent
Sforzin et al.

(10) Patent No.: US 11,915,750 B2
(45) Date of Patent: *Feb. 27, 2024

(54) MEMORY DEVICE AND METHOD FOR OPERATING THE SAME

(71) Applicant: Micron Technology, Inc., Boise, ID (US)

(72) Inventors: Marco Sforzin, Cernusco Sul Naviglio (IT); Paolo Amato, Treviglio (IT); Innocenzo Tortorelli, Cernusco Sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/862,391

(22) Filed: Jul. 11, 2022

(65) Prior Publication Data
US 2022/0343977 A1 Oct. 27, 2022

Related U.S. Application Data

(63) Continuation of application No. 16/959,556, filed as application No. PCT/IB2019/001205 on Dec. 3, 2019, now Pat. No. 11,386,954.

(51) Int. Cl.
*G11C 13/00* (2006.01)
*G11C 29/02* (2006.01)
*G11C 29/12* (2006.01)

(52) U.S. Cl.
CPC ...... *G11C 13/0033* (2013.01); *G11C 13/0004* (2013.01); *G11C 13/004* (2013.01);
(Continued)

(58) Field of Classification Search
CPC ............ G11C 13/0004; G11C 13/0033; G11C 13/004
See application file for complete search history.

(56) References Cited

U.S. PATENT DOCUMENTS

2008/0025079 A1* 1/2008 Philipp .............. G11C 13/0004
                                                                365/207
2012/0063196 A1    3/2012 Kim et al.
(Continued)

FOREIGN PATENT DOCUMENTS

WO   2013/095385 A1   6/2013
WO   2016/160158 A1   10/2016
WO   2017112348       6/2017

OTHER PUBLICATIONS

International Search Report and Written Opinion for related PCT Application No. PCT/IB2019/001205, dated Aug. 31, 2020, 12 pages.

*Primary Examiner* — Alfredo Bermudez Lozada
(74) *Attorney, Agent, or Firm* — Brooks, Cameron & Huebsch, PLLC

(57) ABSTRACT

A memory device can include a plurality of memory cells including a first group of memory cells and a second group of memory cells programmed to a predefined logic state. The plurality of memory cells includes a memory controller configured to apply a reading voltage to at least one selected memory cell of the first group during a reading operation, apply the reading voltage to the memory cells of the second group, and responsive to the logic state of at least one memory cell of the second group being assessed to be different from the predefined logic state perform a refresh operation of the memory cells of the first group by applying a recovery voltage higher than the reading voltage to assess the logic state thereof and reprogramming the memory cells of the first group to the logic state assessed with the recovery voltage.

17 Claims, 6 Drawing Sheets

(52) U.S. Cl.
CPC ...... *G11C 13/0038* (2013.01); *G11C 13/0069* (2013.01); *G11C 29/021* (2013.01); *G11C 29/12005* (2013.01)

(56) References Cited

U.S. PATENT DOCUMENTS

| | | |
|---|---|---|
| 2014/0325314 A1 | 10/2014 | Bedeschi |
| 2016/0284399 A1 | 9/2016 | Mantegazza et al. |
| 2018/0330774 A1 | 11/2018 | Sforzin et al. |
| 2019/0147941 A1 | 5/2019 | Qin et al. |
| 2020/0202953 A1* | 6/2020 | Oh .................... G11C 13/0035 |

\* cited by examiner

MEMORY DEVICE AND METHOD FOR OPERATING THE SAME

This application is a Continuation of U.S. application Ser. No. 16/959,556, filed on Jul. 1, 2020, which is a U.S. National Stage Application under 35 U.S.C. § 371 of International Application Number PCT/IB2019/001205, filed on Dec. 3, 2019, the contents of which are incorporated herein by reference.

BACKGROUND INFORMATION

Technical Field

The present invention relates to the field of electronics, and more specifically to an electronic memory device and to a method of operating said memory device.

Background Art

Electronic memory devices (hereinafter, briefly referred to as "memory devices") are widely used to store data in various electronic devices such as tablets, computers, wireless communication devices (e.g., smartphones), cameras, digital displays, and the like.

Memory devices comprise a plurality of memory cells adapted to store data in the form of programmable logic states. For example, binary memory cells can be programmed into two different logic states, often denoted by a logic "1" (also referred to as "SET" state) or a logic "0" (also referred to as "RESET" state). In other systems, more than two logic states may be stored. To access the stored data, a module/unit of the electronic device may read, or sense, the stored logic state in the memory device. To store data, a module/unit of the electronic device may write, or program, the logic state in the memory device.

Memory devices may be of the non-volatile type or may be of the volatile type. A non-volatile memory device comprises memory cells that are capable of retaining the stored data by maintaining their programmed logic state for extended periods of time even in the absence of an external power source. A volatile memory device comprises memory cells that may lose their stored data over time unless they are periodically refreshed by an external power source.

Several kinds of non-volatile memory devices are known in the art, a non-exhaustive list thereof comprising read-only memory devices, flash memory devices, ferroelectric Random Access Memory (RAM) devices, magnetic memory storage devices (such as for example hard disk drives), optical memory devices (such as for example CD-ROM disks, DVD-ROM disks, Blu-ray disks), Phase Change Memory devices (PCM).

PCM memory devices comprise memory cells each one including a phase-change material element that can be reversibly switched between an amorphous phase and a crystalline phase. The present disclosure relates to improvements in such kind of memory device.

DETAILED DESCRIPTION

Figure 1:
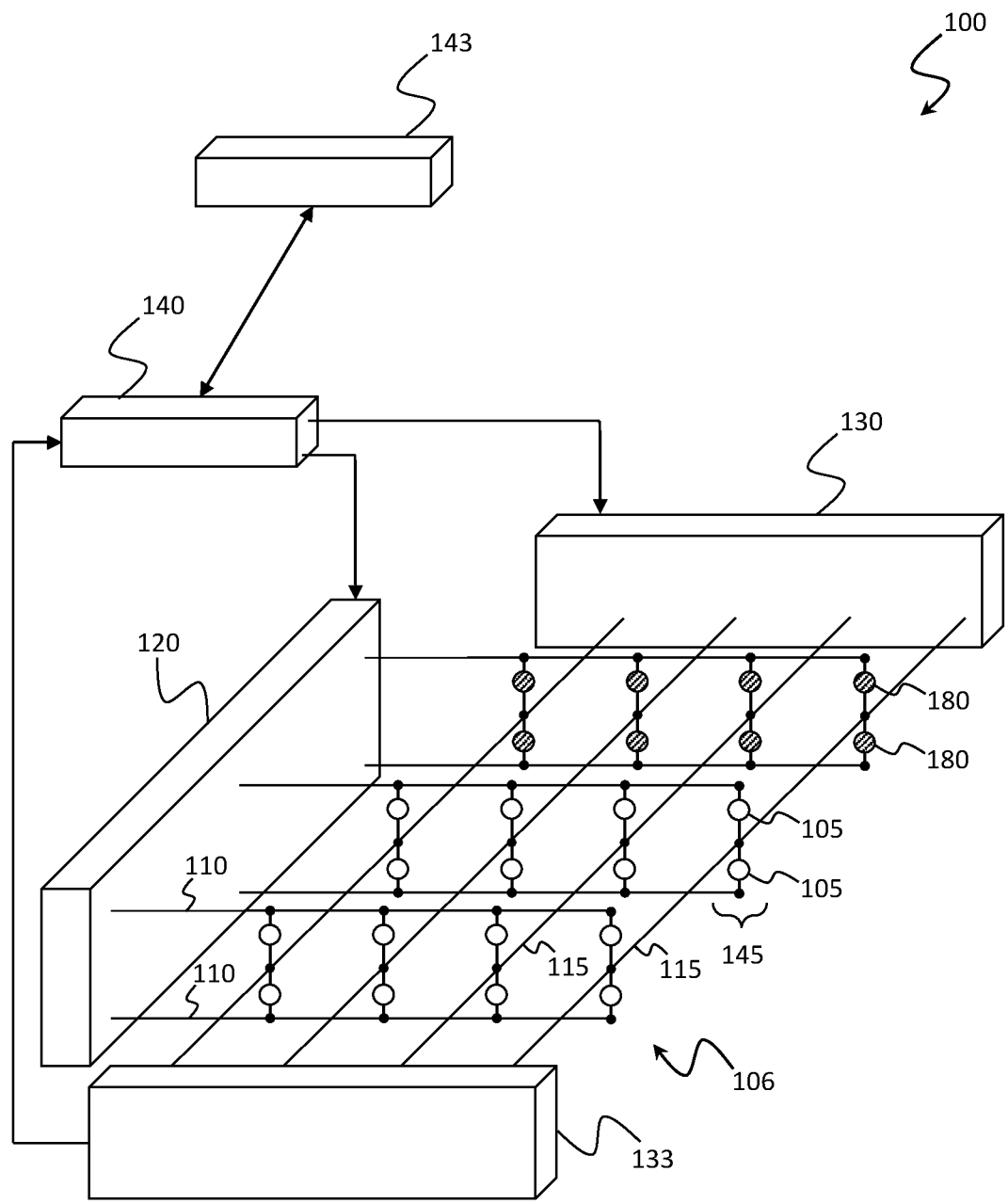
FIG. 1 illustrates an example of a memory device in which a solution according to embodiments of the present invention can be applied.

A phase-change material element exhibits different electric resistivity values depending on its phase, which can be associated to corresponding different logic states. The resistivity of the phase-change material in the amorphous phase is higher than the resistivity of the material in the crystalline phase. Different degrees of partial crystallization can also be possible, having intermediate resistivity values between the one of the (fully) amorphous phase and the one of the (fully) crystalline phase.

Ideally, all memory cells of a PCM memory device (hereinafter, briefly referred to as "PCM cell") should feature a same (nominal) resistivity (and therefore a same threshold voltage, the latter being the voltage to be applied to the memory cells for causing them to conduct a electric current) for a same logic state. However, since different PCM cells programmed to a same logic state practically exhibit different resistivity values because of several factors (such as for example variations in the electrical characteristics of the phase-change material caused by the execution of a number of read-write operations and/or by manufacturing tolerances), each logic state is actually associated to a respective resistivity distribution (typically a Gaussian-type distribution), and therefore to a respective threshold voltage distribution.

In order to assess the logic state of a PCM cell, a reading operation is carried out directed to assess to which threshold voltage distribution the threshold voltage of the PCM cell belongs. For example, a reading voltage may be applied to the PCM cell and the logic state of the PCM cell is assessed based on (the presence or absence of) a current responsive to said reading voltage, the (presence or absence of the) current depending on the threshold voltage of the PCM cell. It should be understood that a cell thresholds (e.g., it becomes conductive) when a voltage difference is applied between its two terminals; such a voltage difference may be obtained in different ways, for example biasing one terminal, such as a word line terminal, to a negative voltage, such as a selection voltage, and the other terminal, such as a bit line terminal, to a positive voltage, such as a reading voltage. Other biasing configurations may produce the same effects (e.g., both the word line and the bit line terminal biased to positive voltage, or the word line terminal biased to a reference voltage, e.g. a ground voltage, and the bit line terminal biased to a positive voltage, for example). For improved clarity but without any limitation, in the following description reference is made to the former case, in which the addressed word line is biased to a (negative) selection voltage (often not explicitly mentioned), lower than a (positive) reading voltage used to bias the addressed bit line. Other access lines, e.g. unaddressed word lines and unaddressed bit lines may be biased to intermediate deselection voltages (e.g., a ground voltage or a positive voltage), as better explained below.

Making reference to a binary PCM memory device, in which two threshold voltage distributions are provided (for example a first threshold voltage distribution corresponding to the SET state and a second threshold voltage distribution corresponding to the RESET state, wherein the threshold voltages of the first threshold voltage distribution are lower than the threshold voltages of the second threshold voltage distribution), the value of the reading voltage is advantageously selected to be higher than the highest threshold voltage of the first threshold voltage distribution and lower than the lowest threshold voltage of the second threshold voltage distribution.

PCM memory devices are negatively affected by a drawback caused by the change (in jargon, "drift") experienced by the resistivity of a PCM cell as time passes after its last programming. Indeed, once a PCM cell has been programmed to a logic state, corresponding to a resistivity value, the resistivity of the cell tends to increase with the passage of time, in a way that depends on several factors, such as the operating temperature of the PCM memory device (the higher the temperature, the faster is the resistivity increase with time), and the resistivity corresponding to the programmed logic state (PCM cells programmed to higher resistivity values experience a faster resistivity time drift compared to PCM cells programmed to lower resistivity values). The resistivity time drift causes in turn a drift of the threshold voltage distributions, which correspondingly move as time passes since the last program operation.

If the drift of the threshold voltage distributions is particularly high because the PCM memory device has not been subjected to program operations for a long time, the value of the reading voltage previously selected for carrying out reading operations could no longer be capable of assessing which threshold voltage distribution the threshold voltage of the PCM cell belongs to.

A solution known in the art provides for defining in advance (e.g., during the design phase of the PCM memory device) a group of (e.g., three) different reading voltages. Each reading voltage of the group is set in such a way to be used for a corresponding period of time which will occur after the last program operation and takes into account the drift of the threshold voltage distributions expected during that period of time.

Since according to the solutions known in the art a group comprising a finite number of reading voltages is provided, a situation will occur in which, after a certain time since the last program operation, the threshold voltage distributions will be shifted to an extent such that none of the reading voltages of the group will be capable of assessing which threshold voltage distribution the threshold voltage of a memory cell belongs to.

In other words, with a finite number of reading voltages, the data retention time (i.e., the time interval—after the last program operation—for which a stored logic state is not lost because of drift) is limited.

The applicant has devised an alternative solution for a PCM memory device and for its operation.

An aspect of the present invention relates to a memory device. According to embodiments of the present invention, the memory device comprises a plurality of memory cells and each memory cell is programmable to at least two logic states.

According to embodiments of the present invention, each logic state corresponds to a respective nominal electric resistance value of the memory cell and the plurality of memory cells comprises a first group of memory cells and a second group of memory cells.

According to embodiments of the present invention, the memory cells of the second group are programmed to a predefined logic state of said at least two logic states.

According to embodiments of the present invention, the memory device further comprises a memory controller coupled to the plurality of memory cells. Moreover, the memory controller is configured to apply a reading voltage to at least one selected memory cell of the first group during a reading operation to assess the logic state thereof according to a current responsive to said applied reading voltage.

The memory controller is also configured to apply the reading voltage to the memory cells of the second group to assess the corresponding logic state.

According to embodiments of the present invention, the memory controller is further configured to, if the logic state of at least one memory cell of the second group is assessed to be different from said predefined logic state, perform a refresh operation of the memory cells of the first group.

According to embodiments of the present invention, the memory controller is configured to perform a refresh operation of the memory cells of the first group by applying a recovery voltage higher than the reading voltage to assess the logic state thereof and then reprogramming the memory cells of the first group to the logic state assessed with the recovery voltage.

According to embodiments of the present invention, said recovery voltage has a predetermined value.

According to embodiments of the present invention, the memory controller is further configured to carry out a recovery voltage setting operation for setting said recovery voltage. Such a recovery voltage setting operation comprises the following sequence of phases:
  a) setting an initial test voltage;
  b) applying a test voltage to the memory cells of the second group to assess the logic state thereof;
  c) if the logic state of at least one memory cell of the second group assessed with the test voltage is different from said predefined logic state, increasing the value of the test voltage and repeating phase b) using said increased value of the test voltage;
  d) if the logic state of all the memory cells of the second group assessed with the test voltage is equal to said predefined logic state, setting said recovery voltage according to the test voltage used in the last phase b) that has been carried out.

According to embodiments of the present invention, the initial test voltage corresponds to said reading voltage and the memory controller is configured to set said recovery voltage to the test voltage used in the last iteration of phase b).

According to embodiments of the present invention, after the first iteration of phase b), the increased test voltage is applied to a subset of the memory cells of the second group, namely to those memory cells for which the logic state has been assessed to be different from said predefined logic state; in other words the cells of the second group that have been assessed to have a logic state equal to the predefined logic state are masked during subsequent applying a test voltage to the memory cells of the second group to assess the logic state thereof (the meaning of which, therefore, includes both the case in which the test voltage is applied to all the cells of the second group and the case in which the test voltage is applied only to a subset of the cells of the second group).

According to embodiments of the present invention, the memory controller is further configured to apply the reading voltage to the memory cells of the second group to assess the logic state thereof at each power-on of the memory device.

According to embodiments of the present invention, the memory device is a non-volatile memory device and each memory cell comprises a logic state storage element including a phase change material.

Said phase change material is a chalcogenide material.

According to embodiments of the present invention, the memory controller is further configured to:

if the logic state of at least one memory cell of the second group is assessed to be different from said predefined logic state, reprogram the memory cells of the second group to said predefined logic state before performing said refresh operation.

The reading voltage is selected among a group of predefined reading voltages based on the last time a memory cell of the first group has been programmed.

The cells of the memory device of the present disclosure are arranged in at least one array of memory cells with the cells of each array being arranged in a plurality of rows and a plurality of columns. This memory device further includes a plurality of word lines and a plurality of bit lines, the memory cells of each row being connected to a corresponding word line and the memory cells of each column being connected to a corresponding bit line, the memory controller being configured to select a memory cell connected to a corresponding word line and to a corresponding bit line for assessing the logic state thereof by:

during a reading operation, biasing the corresponding bit line to a voltage corresponding to the reading voltage, biasing the corresponding word line to a word line selection voltage lower than the reading voltage, and biasing the other word lines to a first deselection voltage intermediate between the word line selection voltage and the bit line reading voltage;

during the recovery voltage setting operation, biasing the corresponding bit line to a voltage corresponding to the test voltage, biasing the corresponding word line to the word line selection voltage, and biasing the other word lines to a second deselection voltage intermediate between the word line selection voltage and the bit line reading voltage and higher than the first deselection voltage;

during the refresh operation, biasing the corresponding bit line to a voltage corresponding to the recovery voltage, biasing the corresponding word line to the word line selection voltage, and biasing the other word lines to the second deselection voltage.

Another aspect of the present invention relates to an electronic apparatus including at least: a processor module, a memory module as previously disclosed, a communication module and a possible a peripheral module.

FIG. 1 shows an exemplary memory device 100 according to embodiments of the present invention.

The memory device 100 is schematically illustrated in FIG. 1 in terms of functional units/modules/blocks/components. According to embodiments of the invention, the memory device 100 is a non-volatile memory device.

According to exemplary embodiments of the invention, the memory device may be comprised in various electronic apparatuses and may be used to store data, such as user and/or system data. For example, said electronic apparatuses may include tablets, computers, wireless communication devices (e.g., smartphones), cameras, digital displays, and the like.

The memory device 100 comprises a plurality of memory cells 105 each one adapted to be programmed to different logic states. According to embodiments of the invention, the memory cells 105 are arranged into an array 106.

In the exemplary embodiments of the invention herein described in detail, each memory cell 105 is a binary memory cell that can be programmed to two different logic states, denoted as logic "1" (or SET state) and logic "0" (or RESET state). In any case, the concepts according to embodiments of the present invention can be also applied to those cases in which each memory cell is a multi-level memory cell adapted to be programmed to more than two different logic states.

The memory cells 105 are for example arranged in a plurality of rows and a plurality of columns. Each row of memory cells 105 is electrically coupled to a word line 110, and each column of memory cells 105 is electrically coupled to a bit line 115. Word lines 110 and bit lines 115 may be substantially perpendicular to one another. It is pointed out that references to word lines and bit lines, or their analogues, are interchangeable without loss of understanding or operation. Word lines 110 and bit lines 115 are conductive lines that may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Generally speaking, a generic memory cell 105 of the array 106 is located at the intersection of two corresponding conductive lines, and particularly at the intersection of a corresponding word line 110 and a corresponding bit line 115. This intersection defines the address of the memory cell 105.

In order to select a set of memory cells 105 located at intersections of conductive lines (such as one word line 110 and one or more bit lines 115) for performing operations thereon (such as for performing a reading or a writing operation), said conductive lines are suitably energized/biased with corresponding biasing or selection voltages.

According to embodiments of the present invention, each memory cell 105 comprises a logic state storage element comprising a material with a variable resistance. Materials with variable resistance may include various material systems, including, for example, metal oxides, chalcogenides, and the like. According to embodiments of the present invention, the logic state storage element is positioned between a first electrode and a second electrode of the memory cell 105. According to embodiments of the invention, one side of the first electrode is electrically coupled to a word line 110 and the other side of the first electrode is electrically coupled to the logic state storage element of the memory cell 105. According to embodiments of the invention, one side of the second electrode is electrically coupled to a bit line 115 and the other side of the second electrode is electrically coupled to the logic state storage element of the memory cell 105.

According to embodiments of the present invention, the memory device 100 is a PCM memory device. According to embodiments of the present invention, the variable resistance material included in the logic state storage element of each memory cell 105 comprises chalcogenide materials or alloys that include at least one of the elements sulfur (S), tellurium (Te), or selenium (Se). Many chalcogenide alloys may be possible—for example, a germaniumantimony-tellurium alloy (Ge—Sb—Te) is a chalcogenide material. Other chalcogenide alloys not expressly recited here may also be employed.

According to embodiments of the present invention, the logic state storage element of a memory cell 105 is electrically coupled to the bit line 115 by a selector element. The word line 110 may be connected to and may control the selector element.

According to embodiments of the present invention, the selector element is a selector transistor. The word line 110 may be connected to the gate of the selector transistor. Energizing the word line 110 results in an electrical connection between the logic state storage element of a memory cell 105 and its corresponding bit line 115. The bit line 115 may then be accessed to either read or write the memory cell 105.

According to an alternative embodiment of the invention, the selector element may comprise an electrically non-linear component (e.g., a non-Ohmic component) such as a metal-insulator-metal (MIM) junction, an Ovonic threshold switch (OTS), or a metalsemiconductor-metal (MSM) switch, among other types of two-terminal selector elements such as a diode. According to embodiments of the invention, the selector element may comprise a chalcogenide alloy. For example, the selector element may comprise an alloy of selenium (Se), arsenic (As), silicon (Si), and germanium (Ge). According to embodiments of the present invention, the logic state storage element and the selector element may be a sole element. In other words, only one element acting both as selector and as storage elements may be coupled between a first electrode and a second electrode of the memory cell 105; the selector and storage element may comprise a chalcogenide material in some examples.

The access to the memory cells 105 may be controlled through a row decoder 120 and a column decoder 130. For example, a row decoder 120 may receive a row address from a memory controller 140 and energize a corresponding word line 110 according to the received row address. Similarly, a column decoder 130 may receive a column address from the memory controller 140 and accordingly energize a corresponding set of bit lines 115.

Upon accessing, a memory cell 105 may be read, or sensed, by a sense unit 133 electrically coupled to the bit lines 115 to assess the stored logic state of the memory cell 105. For example, a reading voltage may be applied to a memory cell 105 (using the corresponding word line 110 and bit line 115) and the logic state thereof is assessed based on a resulting electric current responsive to said reading voltage.

Said electric current depends on a threshold voltage of the memory cell 105 determined by the electrical resistance of the logic state storage element. For example, according to embodiments of the invention a first logic state (e.g., SET state) may correspond to a finite amount of current, whereas a second logic state (e.g., RESET state) may correspond to no current or a negligibly small current. Alternatively, according to another embodiment of the present invention, a first logic state may correspond to a current higher than a current threshold, whereas a second logic state may correspond to a current lower than the current threshold.

In some cases, such as for example when the memory cells 105 are multi-level memory cells adapted to be programmed to more than two different logic states, two or more reading voltages may be applied. For example, a sequence of reading voltages may be applied until a current is detected by sense unit 133.

According to embodiments of the present invention, the sense unit 133 may include various transistors or amplifiers in order to detect and amplify a difference in the signals (e.g., currents) received from selected bit lines 115, and assess the logic states. The assessed (by the sense unit 133) logic state(s) of selected memory cell(s) 105 may then be routed by the memory controller 140 to the output of the memory device 100 through an input/output unit 143.

According to the illustrated embodiment of the present invention, the sense unit 133 is distinct from and not directly connected to the column decoder 130 and the row decoder 120. According to other (not illustrated) embodiments of the invention, the sense unit 133 may be part of a column decoder 130 or row decoder 120, or the sense unit 133 may be connected to or in electronic communication with column decoder 130 or row decoder 120. The sense unit may include less amplifiers than the number of bit lines 115 and the amplifier(s) may be selectively coupled to one of several bit lines during an access operation, for example.

Similarly, memory cells 105 may be set or programmed to chosen logic states by energizing a selected word line 110 and one or more selected bit lines 115 through the column decoder 130 and row decoder 120, for example using data received through the input/output unit 143.

Generally, the memory controller 140 is configured to control the operation (e.g., read, program, re-write, refresh) of the memory device 100 through the row decoder 120, column decoder 130, and sense unit 133. According to various embodiment of the present invention, one or more among the row decoder 120, column decoder 130, and sense unit 133 may be co-located with the memory controller 140. According to embodiments of the present invention, the memory controller 140 is configured to generate row and column address signals in order to energize the desired word line 110 and bit line 115. According to embodiments of the present invention, the memory controller 140 may also generate and control various voltages (e.g., reading voltages) or currents used during the operation of memory device 100.

According to the illustrated embodiments of the invention, the array 106 of memory cells 105 is a 3D array. However, it is pointed out that the concepts of the present invention can be applied as well to a memory device 100 having the memory cells 105 arranged in 2D arrays only.

According to the illustrated embodiments of the invention, the memory cells 105 are arranged according to the 3D XPoint™ (also referred to as cross-point) architecture. In the exemplary embodiment illustrated in the figures, the 3D array 106 comprises two two-dimensional (2D) memory arrays formed adjacent one another forming two levels of memory cells 105 stacked to each other. However, similar considerations apply in case the 3D array 106 comprises more than two 2D memory arrays stacked to each other.

The memory cells 105 of each level are for example arranged in a plurality of rows and a plurality of columns.

The 3D architecture allows to advantageously increase the number of memory cells 105 that may be placed or created on a single die or substrate as compared with 2D architectures. The 3D architecture may thus reduce production costs, or increase the performance of the memory device, or both. In the considered example, each one of the two levels of memory cells 105 is aligned or positioned such that a pair of memory cells 105 may be aligned (exactly, overlapping, or approximately) with one another across each level, forming a corresponding memory cell stack 145.

In the embodiment illustrated in FIG. 1, the two memory cells 105 of a memory cell stack 145 share a common conductive line such as a same bit line 115. In other words, for each memory cell stack 145, a same bit line 115 may be electrically coupled with a bottom electrode of the upper memory cell 105 in the memory cell stack 145 and a top electrode of the lower memory cell 105 in the memory cell stack 145.

However, similar considerations apply to other embodiments in which each memory cell 105 in a memory cell stack 145 (e.g., the upper one, the lower one) is electrically coupled with a respective different bit line. In this case, the memory cells can be separated by means of a dedicated an insulation layer.

Figure 2:
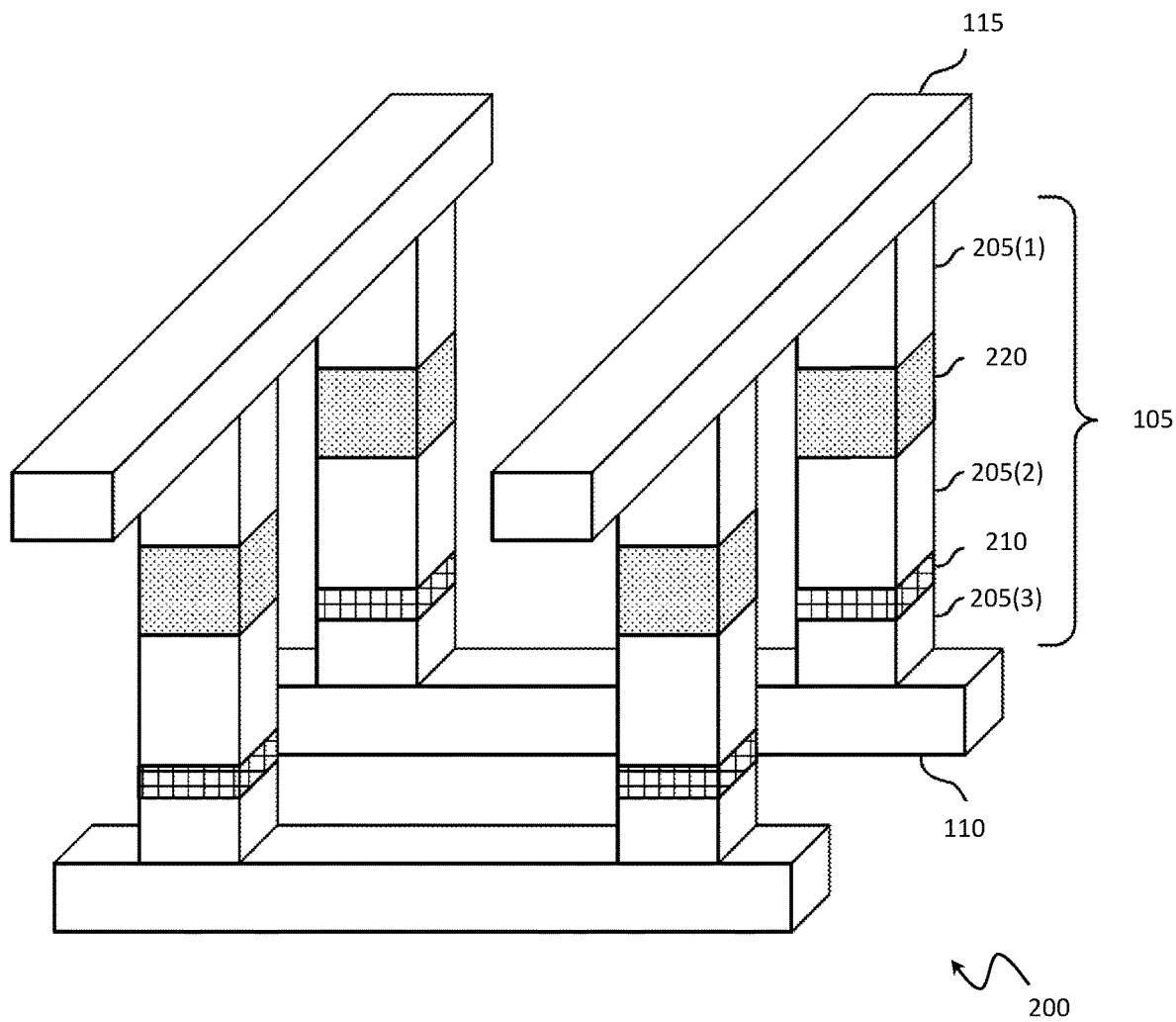
FIG. 2 illustrates in greater detail a portion of an exemplary array of memory cells of the memory device of FIG. 1.

FIG. 2 illustrates in detail an exemplary portion 200 of the array 106 of the memory device 100 illustrated in FIG. 1. Particularly, the portion 200 illustrated in FIG. 2 comprises four adjacent memory cells 105 belonging to the lower level of the 3D array 106, i.e., the memory cells 105 visible in FIG. 2 are the lower memory cells of four respective memory cell stacks 145 (the upper memory cells being not visible in FIG. 2).

In the exemplary embodiment of the invention illustrated in FIG. 2, each memory cell 105 comprises three electrodes 205(1), 205(2), 205(3), a logic state storage element 210, and a selector element 220. According to embodiments of the present invention, the electrode 205(1) has a first end connected to a bit line 115 and a second end connected to the selector element 220. According to embodiments of the present invention, the selector element 220 is further coupled to the logic state storage element 210 through the electrode 205(2). According to embodiments of the present invention, the electrode 205(3) has a first end connected to the logic state storage element 210 and a second end connected to a word line 110. Similar considerations apply in case the positions of the logic state storage element 210 and of the selector element 220 are switched.

According to embodiments, the logic state storage element 210 comprises a variable resistance element including a phase-change material such as a chalcogenide alloy.

In some embodiments, the selector element 220 may include an electrically non-linear component, for example comprising a chalcogenide alloy.

According to another embodiment which is not illustrated, a single component including a chalcogenide alloy could be used for replacing the selector element 220, the logic state storage element 210 and the electrode 205(2).

As already mentioned above, and as known to those skilled in the art, the memory cell 105 can be programmed to different logic states by varying the electrical resistance of the logic state storage element 210, and thus causing a corresponding variation of the threshold voltage of the memory cell 105. For example, said varying the electrical resistance may be caused by forcing a current through the memory cell 105 such to heat the logic state storage element 210 thereof.

For example, in order to program a memory cell 105 to a low-resistance state (e.g., the SET state), current is forced to flow across the memory cell 105 for heating the logic state storage element 210 thereof until the logic state storage element 210 reaches a sufficiently high temperature (but below its melting temperature). This causes in turn the crystallization of the phase change material of the logic state storage element 210.

In order to program a memory cell 105 to a high-resistance state (e.g., the RESET state) current is forced to flow across the memory cell 105 for heating the logic state storage element 210 thereof above its melting temperature, and then by abruptly removing the applied current to let the logic state storage element 210 quickly cool down. In this way, the phase change material of the logic state storage element 210 takes an amorphous structure having a higher resistivity.

As already mentioned above, ideally, all the logic state storage elements 210 of the memory cells 105 of the memory device 100 should feature, for a same logic state, a same (nominal) electrical resistance and therefore a same threshold voltage.

However, since logic state storage elements 210 of different memory cells 105 of the memory device 100 programmed to a same logic state practically exhibit different electric resistivity values, each logic state is associated to a respective threshold voltage distribution. For example, the threshold voltage distributions are Gaussian-type distributions.

Making reference to the diagram illustrated in FIG. 3, with reference 302(0) it is depicted an exemplary threshold voltage distribution of memory cells 105 of the memory device 100 that have been programmed to the SET state (hereinafter, "SET distribution"), while with reference 304(0) it is depicted an exemplary threshold voltage distribution of memory cells 105 of the memory device 100 that have been programmed to the RESET state (hereinafter, "RESET distribution").

Figure 3:
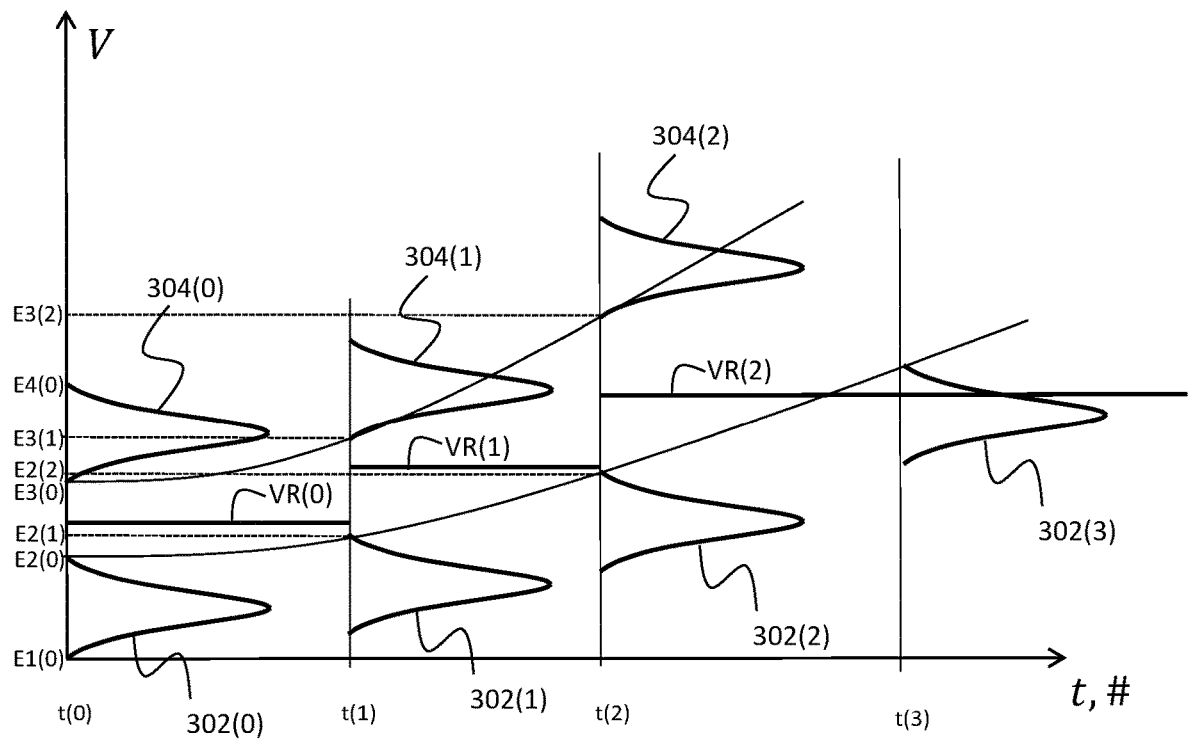
FIG. 3 illustrates exemplary threshold voltage distributions of memory cells of the memory device of FIG. 1.

In the example illustrated in FIG. 3, the SET distribution 302(0) has a lower edge corresponding to a voltage $E1(0)$ and an upper edge corresponding to a voltage $E2(0)$, with $E2(0)>E1(0)$. This means that, according to this example, the threshold voltages of the memory cells 105 that have been programmed to the SET state have values comprised in the interval $[E1(0), E2(0)]$.

In the example illustrated in FIG. 3, the RESET distribution 304(0) has a lower edge corresponding to a voltage $E3(0)$ and an upper edge corresponding to a voltage $E4(0)$, with $E4(0)>E3(0)$. This means that, according to this example, the threshold voltages of the memory cells 105 that have been programmed to the RESET state have values comprised in the interval $[E3(0), E4(0)]$.

According to embodiments, in order to avoid that the SET distribution 302(0) and the RESET distribution 304(0) overlaps, and therefore in order to avoid the occurrence of wrong readings, the lower edge $E3(0)$ of the RESET distribution 304(0) has to be sufficiently higher than the upper edge $E2(0)$ of the SET distribution $E2(0)$, so as to provide a sufficiently large safe voltage interval between the two distributions.

The exemplary SET distribution 302(0) and RESET distribution 304(0) of FIG. 3 illustrate an example of how the threshold voltages of the memory cells 105 are distributed across the memory cells 105 of the memory device 100 at a time $t(0)$ corresponding for example to a last memory cell 105 program operation.

As already mentioned in the foregoing, during a reading operation, a reading voltage may be applied to a target memory cell 105 to be accessed and the logic state of the latter may be assessed based on a resulting current flowing across the target memory cell 105 responsive to said reading voltage. Said current depends on the threshold voltage of the memory cell 105. For example, making reference to a reading operation occurring not long after the last memory cell 105 program operation (e.g., at a time not long after time $t(0)$), a reading voltage $VR(0)$ may be used that is higher than the upper edge $E2(0)$ of the SET distribution $E2(0)$ and at the same time is lower than the lower edge $E3(0)$ of the RESET distribution 304(0).

Making reference to the illustrated example, the following takes place.

If the logic state of the target memory cell 105 is the SET state, the applied reading voltage $VR(0)$ is higher than the threshold voltage of the target memory cell 105, which is comprised in the interval $[E1(0), E2(0)]$. In this situation, a finite current flows across the target memory cell 105.

If the logic state of the target memory cell 105 is the RESET state, the applied reading voltage VR(0) is lower than the threshold voltage of the target memory cell 105, which is comprised in the interval [E3(0), E4(0)]. In this situation, no current flows across the target memory cell 105, or only a negligibly small current, substantially lower than the current corresponding to the case of the SET state.

As mentioned above, the resistivity of the phase-change material (e.g., chalcogenide alloy) comprised in the logic state storage elements 210 of the memory cells 160 is subjected to an increase (drift) as time passes since the last program operation. The drift in resistivity causes in turn a drift of the threshold voltage distributions, which correspondingly shift (toward higher voltages) as time passes since the last program operation.

An example of how the SET distribution and the RESET distribution move because of the drift is illustrated in FIG. 3, wherein:

- the SET distribution at a time t(1)>t(0) since a last memory cell 105 program operation is identified with reference 302(1);
- the SET distribution at a time t(2)>t(1) since a last memory cell 105 program operation is identified with reference 302(2);
- the RESET distribution at time t(1) is identified with reference 304(1);
- the RESET distribution at time t(2) is identified with reference 304(2).

Making reference to the not limitative illustrated example, as time passes since the last program operation, the upper edge of the SET distribution and the lower edge of the RESET distribution increase. Indeed, the upper edge E2(1) of the SET distribution 302(1) at time t(1) is higher than the upper edge E2(0) of the SET distribution 302(0) at time t(0). The upper edge E2(2) of the SET distribution 302(2) at time t(2) is higher than the upper edge E2(1) of the SET distribution 302(1) at time t(1). The lower edge E3(1) of the RESET distribution 304(1) at time t(1) is higher than the lower edge E3(0) of the RESET distribution 304(0) at time t(0). The lower edge E3(2) of the RESET distribution 304(2) at time t(2) is higher than the lower edge E3(1) of the RESET distribution 304(1) at time t(1).

As can be seen from the example illustrated in FIG. 3, if the time passed since the last program operation is sufficiently large, the value of the reading voltage VR(0)—set to be higher than the upper edge E2(0) of the SET distribution E2(0) and at the same time lower than the lower edge E3(0) of the RESET distribution 304(0)—could eventually be no longer capable of fully discriminating between memory cells 105 programmed to the SET state and memory cells 105 programmed to the RESET state. For example, if the reading voltage VR(0) was used at time t(2), i.e., after that the time passed since the last program operation is t(2)–t(0), a fraction of memory cells 105 whose threshold voltages belong to the SET distribution 302(2), and particularly those cells whose threshold voltages belong to the higher portion of the SET distribution 302(2), would result to have threshold voltages higher than the reading voltage VR(0). In other words, a fraction of memory cells 105 in the SET logic state would be incorrectly assessed to be in the RESET logic state.

For this reason, according to embodiments, a group of different reading voltages VR(i) is defined in advance. According to embodiments, each reading voltage VR(i) of the group is directed to be used only for a corresponding time interval T(i)=[t(i), t(i+1)) occurring after the last program operation. According to embodiments, the value of each reading voltage VR(i) is calculated in advance in such a way to be higher than the expected upper edge E2(i) of the SET distribution 302(i) and at the same time lower than the expected lower edge E3(i) of the RESET distribution 304(i) at a time t(i) since the last program operation. According to embodiments, the number of reading voltages VR(i), and/or the values of the reading voltages VR(i), and/or the time intervals T(i) are set in advance during the design phase of the memory device 100.

Making reference to the exemplary case illustrated in FIG. 3, three reading voltages are considered:

- a first reading voltage VR(0) is defined to be used for carrying out reading operations during a first time interval T(0) starting from the end of last program operation (time t(0));
- a second reading voltage VR(1) (higher than the first reading voltage VR(0)) is defined to be used for carrying out reading operations during a second time interval T(1) starting from the end of the first interval T(0);
- a third reading voltage VR(2) (higher than the second reading voltage VR(1)) is defined to be used for carrying out reading operations during a third time interval T(2) starting from the end of the second interval T(1).

According to this example, the reading voltage VR(1) is higher than the upper edge E2(1) of the SET distribution 302(1) and at the same time lower than the lower edge E3(1) of the RESET distribution 304(1), and the reading voltage VR(2) is higher than the upper edge E2(2) of the SET distribution 302(2) and at the same time lower than the lower edge E3(2) of the RESET distribution 304(2).

Given that a finite number of reading voltages VR(i) is provided (in the considered example, three), a situation will occur in which, after a certain amount of time since the last program operation, the SET distribution will be shifted upward to such an extent to cross the last (and highest) reading voltage VR(i) of the group (in the considered example, the reading voltage VR(2)). In this situation, the value of the last (and highest) reading voltage VR(i) of the group could no longer be capable of fully discriminating memory cells 105 programmed to the SET state from memory cells 105 programmed to the RESET state. An example of this situation is illustrated in FIG. 3, wherein, at a time t(3) subsequent to time t(2), the corresponding SET distribution 302(3) is shifted upwards crossing the reading voltage VR(2).

In other words, with a finite number of reading voltages VR(i), the data retention time (i.e., the time interval—after the last program operation—for which a stored logic state is not lost because of drift) is limited.

Current minimum operative requirements for non-volatile memory devices provide for a data retention time of 7 years at a temperature of 40° C. for standard applications, and a data retention time of 5 years at a temperature of 55° C. for mobile applications.

While current PCM technology allows to fulfil the minimum operative requirements for standard applications, the same technology cannot guarantee the desired data retention time at a temperature of 55° C. or higher.

According to embodiments of the present invention which will be described hereinbelow, a system and a method is provided for increasing the data retention time of the memory device 100.

Returning to FIG. 1, according to embodiments of the invention, the memory device 100 further comprises a group of cells (hereinafter referred to as "sentinel cells" and identified with reference 180) that are programmed to a predefined logic state.

According to embodiments of the present invention, the predefined logic state is the same for all the sentinel cells 180. According to embodiments of the present invention, the predefined logic state is the logic state corresponding to the threshold voltage distribution comprising the lowest threshold voltages. According to embodiments of the present invention, the predefined logic state is the SET logic state.

According to embodiments of the present invention, the sentinel cells 180 are selected during a design phase of the memory device 100. According to embodiments of the invention, the sentinel cells 180 are sparsely (e.g., randomly) located in the array 106 together with the memory cells 105. According to another embodiment of the present invention, the sentinel cells 180 are located in specific parts of the array 106, such as for example at borders and/or at corners and/or in the center of the array 160. According to embodiments of the invention, if the array 106 is a 3D array comprising a number of two-dimensional (2D) memory arrays forming a number of levels of memory cells 105 stacked to each other, the sentinel cells 180 may be located in every level of memory cells 105, or they may be located in only a subset of levels of memory cells 105 (e.g., only one).

According to embodiments of the present invention not illustrated in the figures, the sentinel cells 180 are arranged in a dedicated array different from the array 106.

According to another embodiment of the present invention, instead of being selected during a design phase of the memory device 100, the sentinel cells 180 are dynamically selected, for example randomly, during a first power on of the memory device 100. In this case, the addresses of the sentinel cells 180 are stored in a corresponding register or in an equivalent unit/module for allowing a selection thereof.

According to embodiments of the present invention, the number of sentinel cells 180 compared to the number of memory cells 105 depends on the material used for the logic state storage elements 210 of the memory cells.

According to embodiments of the invention, the sentinel memory cells 180 are structurally identical to the memory cells 105, the only difference consisting in that the sentinel cells 180 are programmed to a predefined logic state. According to embodiments of the present invention, the sentinel memory cells 180 are programmed in such a way that their threshold voltages are located in the upper portion of the threshold voltage distribution (i.e., the one with highest threshold voltages) corresponding to the predefined logic state.

According to another embodiment of the present invention, the sentinel cells 180 are manufactured in such a way to exhibit a slighter higher nominal threshold voltage compared to the other memory cells 105.

Therefore, according to embodiments of the invention, the array 106 comprises two groups of memory cells, i.e., a first group of "standard" memory cells 105 directed to store data, e.g., user data, and a second group of sentinel cells 180 which are programmed to a predefined logic state.

According to embodiments of the invention, the sentinel cells 180 are exploited during a recovery procedure directed to counteract the effect of the threshold voltage distribution drift.

According to some embodiments of the present invention illustrated in the figures, the recovery procedure is carried out by the memory controller 140. On this regard, the memory controller 140 and/or at least some portions thereof may be implemented in hardware, software executed by a processor module/unit, firmware, or any combination thereof. For example, the processor module/unit may be general-purpose processor, a digital signal processor (DSP), an application-specific integrated circuit (ASIC), an field-programmable gate array (FPGA) or other programmable logic device, discrete gate or transistor logic, discrete hardware components, or any combination thereof designed to perform the functions described in the present disclosure.

Figure 4:
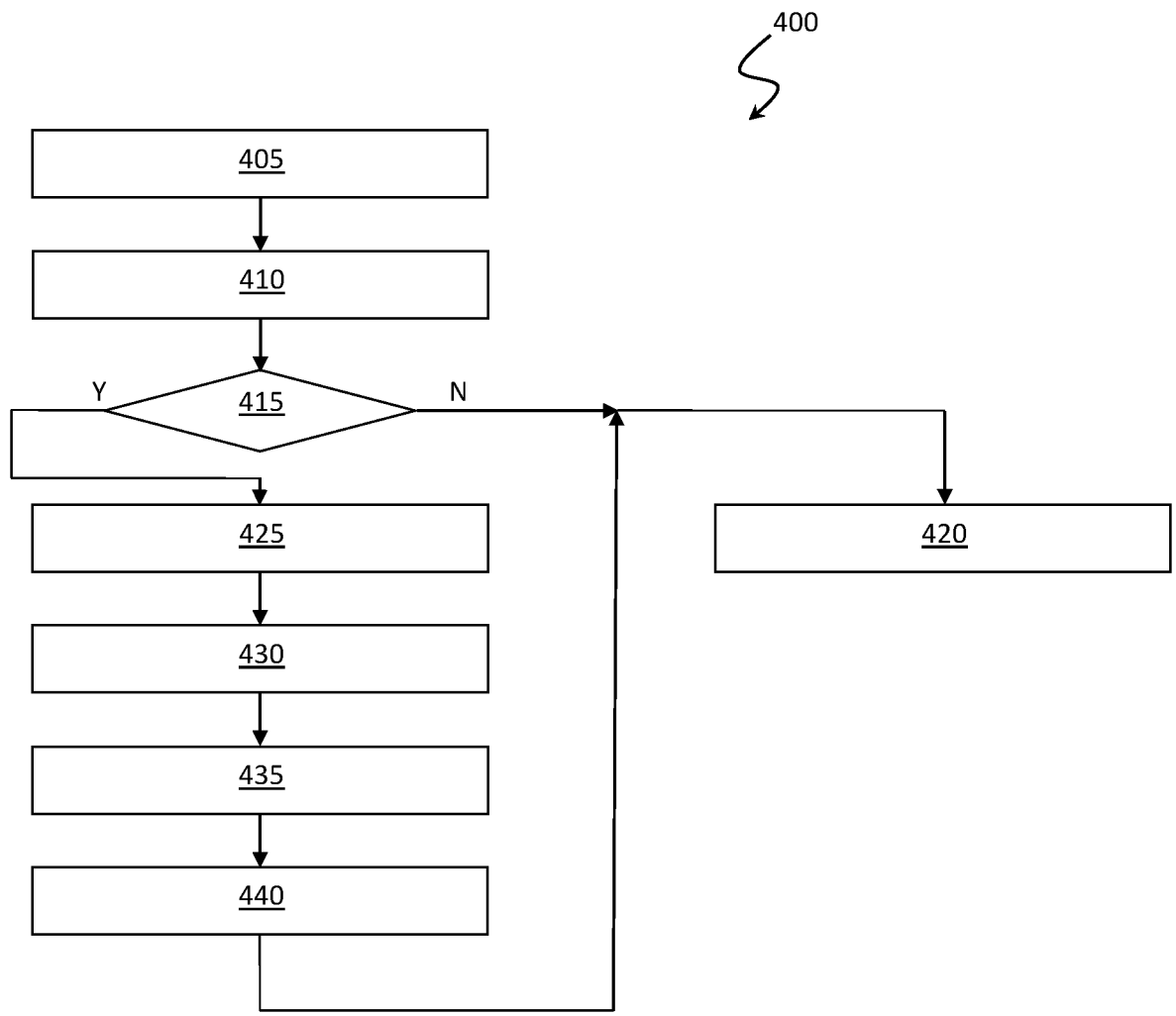
FIG. 4 illustrates in terms of functional blocks a recovery procedure for the memory device of FIG. 1 according to embodiments of the invention.

According to other embodiments of the present invention not illustrated in the figures, the recovery procedure is instead carried out at least partially by a dedicated module (implemented in hardware, software executed by a processor module/unit, firmware, or any combination thereof) different from the memory controller 140. The recovery procedure according to embodiments of the invention is shown in terms of functional blocks in the flow chart illustrated in FIG. 4 and it is globally identified with reference 400.

According to embodiments of the present invention, the recovery procedure 400 is started at each power-on of the memory device 100 (block 405). According to other embodiments of the invention not illustrated, the recovery procedure may be also triggered at different times, such as for example periodically and/or when the memory device 100 is in a stand-by state.

According to embodiments of the present invention, the memory controller 140 carries out a reading operation directed to assess the logic state of the sentinel cells 180 (block 410).

For this purpose, according to embodiments of the present invention, all or some of the sentinel cells 180 are selected, and a corresponding voltage is applied thereto. According to embodiments of the invention, the voltage used to read the sentinel cells 180 is the highest reading voltage among the group of reading voltages VR(i). Making reference to the example at issue, in which the group of reading voltages includes the three reading voltages VR(0), VR(1), VR(2), the sentinel cells 180 are read by exploiting the reading voltage VR(2).

According to another embodiment of the invention, the voltage used to read the sentinel cells 180 is a function of the highest reading voltage among the group of reading voltages VR(i).

Making reference to the example at issue, the sentinel cells 180 may be read by exploiting a voltage that is a function of the reading voltage VR(2), such as for example a fraction of the reading voltage VR(2) (e.g., the 90% or 80% of the reading voltage VR(2)). In other examples, the sentinel cells may be read using a voltage that is smaller than the reading voltage VR(2) by a predefined quantity (e.g., the reading voltage may be VR(2)−0.5V or VR(2)−2.0V).

According to embodiments of the invention, once the logic state of the sentinel cells 180 has been assessed, the memory controller 140 checks whether the read logic states of all the sentinel cells 180 correspond to the predefined logic state (e.g., the SET state) or not (block 415).

Since the sentinel cells 180 are equal or at least similar to the memory cells 105, and are subjected to the same or to very similar environmental/electric/operative stimuli, according to embodiments of the present invention, the sentinel cells 180 are used as samples to test the actual condition (from the drift point of view) of the rest of the memory cells 105 of the array 106.

According to embodiments of the present invention, if all the read sentinel cells 180 are assessed to store the predefined logic state (e.g., the SET state), it means that the time passed since a last program operation has not been sufficient to allow that the threshold voltage distributions drift to an extent such to compromise the result of reading operations directed to the memory cells 105. In this case (exit branch N of block 415), no refresh operation is required, and the memory cells 105 can be subjected to standard (e.g., read and/or program) operations depending on the particular application of the memory device 100 (block 420).

According to embodiments of the present invention, if the logic state of at least one sentinel cell 180 is assessed to be different from the predefined logic state (e.g., if the assessed logic state of at least one sentinel cell 180 is assessed to be different from the SET state, such as for example is assessed to be the RESET state), it means that in the actual conditions, at least some of the memory cells 105 could have experienced a drift sufficiently large to compromise the result of potential reading operations directed to said memory cells 105. In this case (exit branch Y of block 415), a refresh operation is carried out, to reset the effect of the drift and push back the threshold voltage distributions to "freshly-programmed" positions by recovering the logic states of the memory cells 105 and then rewriting/reprogramming the recovered logic states to the same memory cells 105.

According to embodiments of the present invention, once the memory controller 140 has assessed that a refresh operation have to be carried out, it sets a recovery voltage VREC (block 425) to be used for recovering the logic states of the memory cells 105 of the array 106 in a safe way even if the threshold voltages of some of said memory cells 105 have been affected by a serious drift.

According to embodiments of the present invention, the recovery voltage VREC is higher than the highest reading voltage among the group of reading voltages VR(i) (e.g., higher than VR(2)).

According to embodiments of the present invention, the recovery voltage VREC is set to a fixed predetermined value, which is defined during a design and/or test phase of the memory device 100. According to embodiments of the invention, the recovery voltage is selected to be sufficiently higher than the highest reading voltage among the group of reading voltages VR(i) to allow to correctly read the logic state of those memory cells 105 whose threshold voltages exceed the highest reading voltage among the group of reading voltages VR(i) because of drift.

Figure 5:
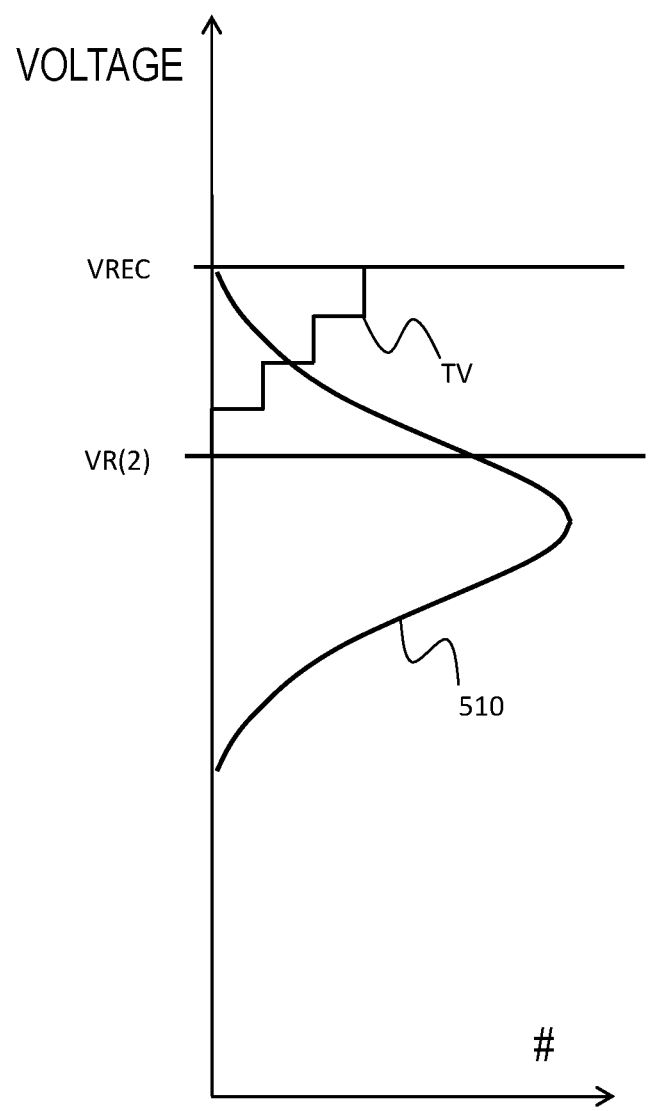
FIG. 5 illustrates the evolution of a test reading voltage during iterations of a recovery voltage setting operation according to embodiments of the invention.

According to another embodiment of the present invention, the recovery voltage VREC is dynamically set by taking into account the actual condition of the memory cells 105 (from the drift point of view). According to embodiments of the present invention, the recovery voltage VREC is set through a recovery voltage setting operation to a value that is sufficiently high to exceed the higher threshold voltages belonging to the lowest threshold voltage distribution (e.g., the SET distribution), and at the same time that is not excessively high to cause other disturbance effects. According to embodiments of the present invention illustrated in FIG. 5, the recovery voltage setting operation provides for an iteration of reading operations using a test reading voltage TV that is incremented at each iteration. According to embodiments of the present invention, the value of the test reading voltage TV of the first iteration is set to the highest reading voltage among the group of reading voltages VR(i) (e.g., VR(2)). According to another embodiment of the present invention, the value of the test reading voltage TV of the first iteration is instead set to a value higher than the highest reading voltage among the group of reading voltages VR(i) (e.g., higher than VR(2)).

According to embodiments of the invention, at each iteration, the memory controller 140 applies the test reading voltage TV to the sentinel cells 180 in order to assess the logic state thereof.

According to embodiments of the present invention, if the logic state of at least one sentinel memory cell 180 assessed with the current test reading voltage TV is different from the predefined logic state (e.g., different from the SET state), the test reading voltage TV is increased by a fixed or variable amount, and a next iteration is carried out, by applying the increased test reading voltage TV to the sentinel cells 180 in order to assess the logic state thereof.

According to embodiments of the present invention, if the logic state of all the sentinel memory cells 180 assessed with the current test reading voltage TV is equal to the predefined logic state (e.g., equal to the SET state) the iteration of reading operations using the test reading voltage TV is interrupted. As can be seen in the example illustrated in FIG. 5, the test reading voltage TV of the last iteration is therefore sufficiently high to exceed also the upper edge of the SET distribution formed by the threshold voltages of the sentinel cells 180 (identified in FIG. 5 with reference 510). In this situation, according to embodiments of the present invention, the memory controller 140 sets the recovery voltage VREC according to the test reading voltage TV of the last iteration.

According to embodiments of the invention, the memory controller 140 sets the recovery voltage VREC to the value of the test reading voltage TV of the last iteration.

According to another embodiment of the invention, the memory controller 140 sets the recovery voltage VREC to a value that is function of, e.g., it is based on, the value of the test reading voltage TV of the last iteration, such as for example 5% or 10% more than the value of the test reading voltage TV of the last iteration. In another example, the memory controller 140 sets the recovery voltage VREC to a value that is function of the value of the test reading voltage TV of the last iteration, such as for example 50 mV or 200 mV more than the value of the test reading voltage TV of the last iteration.

According to embodiments of the present invention, once the recovery voltage VREC has been set, the memory controller 140 rewrites/reprograms the sentinel cells 180 to the predefined logic state (e.g., the SET state) (block 430). In this way, the effect of the drift on the sentinel cells 180 is reset, and the threshold voltages thereof are pushed back to approximately the values they had just after their last program operation.

At this point, according to embodiments of the invention, the memory cells 105 of the array 106 are subjected to a refresh operation exploiting the recovery voltage VREC (blocks 435, 440).

According to embodiments of the invention, the refresh operation provides for recovering the logic states of the memory cells 105 by carrying out a read operation in which the logic states of the memory cells are assessed using the recovery voltage VREC as reading voltage (block 435). Since the sentinel cells 180 reflects the actual condition (from the drift point of view) of the rest of the memory cells 105 of the array 106, and since the recovery voltage VREC has been set in such a way to be higher to exceed the upper edge of the SET distribution corresponding to the threshold voltages of the sentinel cells 180, the reading operations carried out using the recovery voltage VREC have a very high probability of giving a correct result despite the presence of heavy drifts.

According to embodiments of the invention, the recovered logic states of the memory cells 105 may be temporally stored in a buffer register, or in a different memory device, such as a flash memory device (not illustrated in the figures), or also in another portion of the memory array 106.

According to embodiments of the invention, the memory cells 105 are then rewritten/reprogrammed to their corresponding recovered logic states (block 440). In this way, the effect of the drift on the memory cells 105 is reset, and the threshold voltages thereof are pushed back to approximately the values they had just after their last program operation.

Once the refresh operation is carried out, the memory cells 105 can be subjected to standard (e.g., read and/or program) operations depending on the particular application of the memory device 100 (go to block 420).

According to the embodiments of the present invention described in the present disclosure, the memory cells 105, as well as the sentinel cells 180 are selected by the memory controller 140 through the row decoder 120 and the column decoder 130 to assess their logic states in different situations for different purposes.

According to embodiments of the present invention, the selection of a memory cell 105 during a standard reading operation may provide for biasing the corresponding bit line 115 to a voltage corresponding to one of the reading voltage among the group of reading voltages VR(i) (or VREC during a recovering phase after drift), and biasing the corresponding word line 110 to a word line selection voltage VS lower than the reading voltage VR(i). According to embodiments of the present invention, the bit lines 115 corresponding to the unselected memory cells 105 may be biased to a first deselection voltage VD(1) intermediate between the word line selection voltage and the bit line reading voltage, such as for example the ground voltage. According to embodiments of the present invention, also the word lines 110 corresponding to the unselected memory cells 105 may be biased to the first deselection voltage VD(1), such as for example to the ground voltage.

Since the voltages used for accessing the memory cells 105 and/or the sentinel cells 180 during the refresh operations and the recovery voltage setting operations are higher than the reading voltages VR(i) used during standard reading operations, unwanted leakage losses could be experienced for memory cells that are not selected but that correspond to the same word line and/or the same bit line of the selected memory cell(s). According to some embodiments of the present invention, in order to reduce said leakage losses, the unselected word lines are advantageously biased to a second deselection voltage VD(2) higher than the first deselection voltage VD(1) during the recovery voltage setting operations and/or the refresh operations.

According to embodiments of the invention, the selection of a memory cell 105 during a recovery voltage setting operation may provide for biasing the corresponding bit line 115 to a voltage corresponding to the test voltage TV and biasing the corresponding word line 110 to a word line selection voltage VS lower than the test voltage TV. According to embodiments of the present invention, the bit lines 115 corresponding to the unselected memory cells 105 may be biased to a first deselection voltage VD(1) intermediate between the word line selection voltage and the bit line reading voltage, such as for example the ground voltage. According to embodiments of the present invention, the word lines 110 corresponding to the unselected memory cells 105 may be biased to a second deselection voltage VD(2) higher than the first deselection voltage VD(1).

According to embodiments of the invention, the selection of a memory cell 105 during a refresh voltage setting operation may provide for biasing the corresponding bit line 115 to a voltage corresponding to the recovery voltage VREC and biasing the corresponding word line 110 to a word line selection voltage VS lower than the recovery voltage VREC. According to embodiments of the present invention, the bit lines 115 corresponding to the unselected memory cells 105 may be biased to a first deselection voltage VD(1) intermediate between the word line selection voltage and the bit line reading voltage, such as for example the ground voltage. According to embodiments of the present invention, the word lines 110 corresponding to the unselected memory cells 105 may be biased to a second deselection voltage VD(2) higher than the first deselection voltage VD(1).

Figure 6:
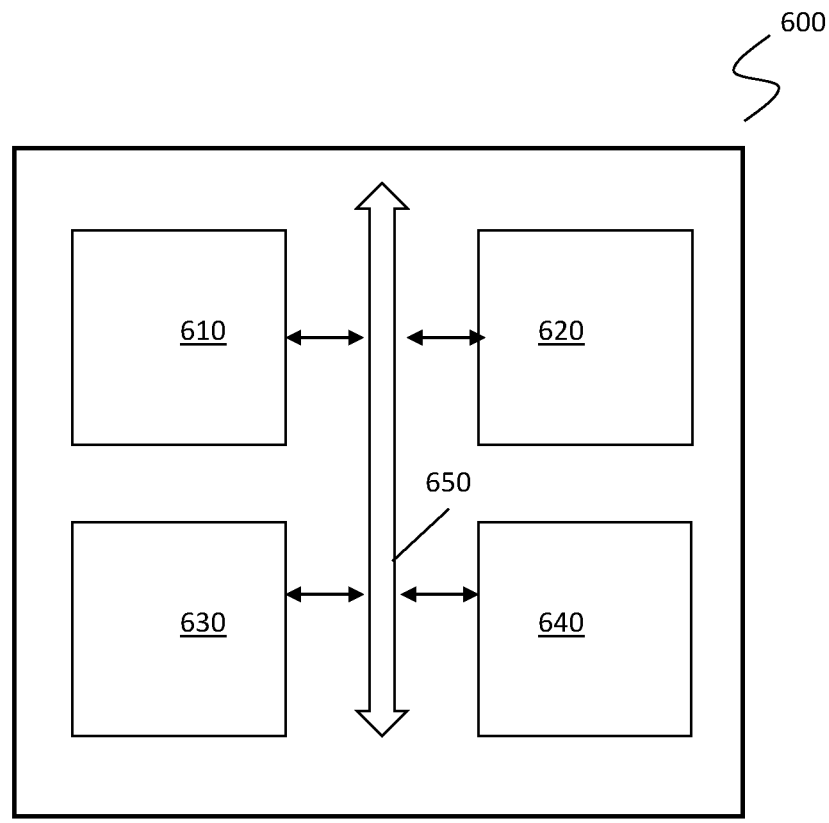
FIG. 6 illustrates an example of an electronic apparatus comprising the memory device of FIG. 1 according to embodiments of the invention.

FIG. 6 illustrates in terms of functional units/modules/blocks/components an example of an electronic apparatus 600 comprising the memory device 100 according to embodiments of the invention.

The electronic apparatus 600 may be a tablet, a computer, a wireless communication device, such as a smartphone, a camera, a digital display, and the like.

In the exemplary embodiment illustrated in FIG. 6, the electronic apparatus 600 may comprises one or more among processor module 610, a memory module 620, a communication module 630, and one or more peripheral modules 640.

The processor module 610 may be a microprocessor, a digital signal processor, a microcontroller, or other units capable of executing software and or firmware.

The memory module 620 may comprise one or more memory devices adapted to store data, such as system data for the operation of the electronic apparatus and/or user data. For example, said one or more memory devices comprise the memory device 100 according to embodiments of the invention described above. Those components are interconnected by a bus 650 or similar interconnection means.

The communication module 630 is configured to enable communications between the electronic apparatus 600 and other electronic apparatuses. For example, the communication module can comprise a Bluetooth® communication circuit, a Wi-Fi® communication circuit, and/or a radio circuit configured to allow the electronic apparatus 600 to communicate with other electronic devices over a mobile network connection.

The one or more peripheral modules 640 may comprise input/output devices, interface devices, and/or other peripheral devices, such as for example a microphone, a keyboard, switches, a display, one or more speakers, and so on.

The previous description presents and discusses in detail several embodiments of the present invention; nevertheless, several changes to the described embodiments, as well as different invention embodiments are possible, without departing from the scope defined by the appended claims.

The invention claimed is:

1. A memory device, comprising:
   a plurality of memory cells, comprising:
      a first group of memory cells; and
      a second group of memory cells programmed to a predefined logic state of the at least two logic states; and
   a memory controller coupled to the plurality of memory cells and configured to carry out a recovery voltage setting operation to set the recovery voltage, the recovery voltage setting operation comprising:
      applying a test voltage corresponding to a reading voltage applied to at least one selected memory cell of the first group of memory cells to the memory cells of the second group to assess a logic state thereof;
      biasing a corresponding word line to a word line selection voltage lower than the reading voltage;

responsive to the logic state of at least one memory cell of the second group assessed with the test voltage being different from the predefined logic state:
increasing the value of the test voltage;
repeating application of the test voltage to the memory cells of the second group to assess the logic state thereof using the increased value of the test voltage; and
responsive to the logic state of all the memory cells of the second group assessed with the test voltage being equal to the predefined logic state, setting the recovery voltage according to the test voltage used in a last application of the test voltage to the memory cells of the second group to assess the logic state thereof that has been carried out.

2. The memory device of claim 1, further comprising the memory controller configured to set the recovery voltage to a voltage based on the test voltage used in a last iteration of application of the test voltage to the memory cells of the second group.

3. The memory device of claim 1, further comprising the memory controller configured to set an initial test voltage.

4. The memory device of claim 1, wherein the memory controller is configured to apply the reading voltage to the memory cells of the second group to assess the logic state thereof at each power-on of the memory device.

5. The memory device of claim 1, wherein each memory cell of the plurality of memory cells comprises a logic state storage element including a chalcogenide material.

6. The memory device of claim 1, wherein the reading voltage is selected among a group of predefined reading voltages based on a last time a memory cell of the first group was programmed.

7. A method for operating a memory device, comprising:
applying a reading voltage to a first group and a second group of memory cells of a memory component;
reprogramming the memory cells of the first group to the logic state assessed with a recovery voltage;
carrying out a recovery voltage setting operation to set the recovery voltage, the recovery voltage setting operation comprising:
applying a test voltage to the memory cells of the second group to assess a logic state thereof;
responsive to the logic state of at least one memory cell of the second group assessed with the test voltage being different from the predefined logic state:
increasing the value of the test voltage; and
repeating application of the test voltage to the memory cells of the second group to assess the logic state thereof using the increased value of the test voltage;
responsive to the logic state of all the memory cells of the second group assessed with the test voltage being equal to the predefined logic state, setting the recovery voltage to a voltage based on the test voltage used in a last iteration of application of the test voltage to the memory cells of the second group; and
biasing a corresponding bit line to a voltage corresponding to the reading voltage.

8. The method of claim 7, further comprising biasing a corresponding word line to a word line selection voltage lower than the reading voltage.

9. The method of claim 8, further comprising biasing other word lines to a first deselection voltage intermediate between the word line selection voltage and the bit line reading voltage.

10. The method of claim 7, further comprising setting an initial test voltage corresponding to the reading voltage.

11. A memory device, comprising:
a plurality of memory cells arranged in at least one array of memory cells, wherein the plurality of memory cells comprises:
a first group of memory cells; and
a second group of memory cells programmed to a predefined logic state of at least two logic states, each logic state corresponding to a respective nominal electric resistance value of the each of the memory cells of the second group; and
a memory controller coupled to the plurality of memory cells and configured to:
set an initial test voltage such that it corresponds to a reading voltage applied to the memory cells of the second group;
bias a corresponding word line to a word line selection voltage lower than the reading voltage;
apply a test voltage to the memory cells of the second group to assess a logic state thereof;
responsive to the logic state of at least one memory cell of the second group assessed with the test voltage being different from the predefined logic state, increase the value of the test voltage; and
responsive to the logic state of all the memory cells of the second group assessed with the test voltage being equal to the predefined logic state, set the recovery voltage according to the test voltage used in the last application of the test voltage to the memory cells of the second group.

12. The memory device of claim 11, further comprising the memory controller configured to repeat application of the test voltage to the memory cells of the second group to assess the logic state thereof using the increased value of the test voltage.

13. The memory device of claim 11, further comprising the memory controller configured to reprogram the memory cells of the first group to a logic state assessed with the recovery voltage.

14. The memory device of claim 11, further comprising the memory controller configured to set the recovery voltage to a voltage based on the test voltage used in a last iteration of application of the test voltage to the memory cells of the second group.

15. The memory device of claim 11, further comprising the memory controller configured to apply the reading voltage to at least one selected memory cell of the first group during a reading operation.

16. The memory device of claim 11, further comprising the memory controller configured to reprogram the memory cells of the second group to a predefined logic state responsive to the logic state of at least one memory cell of the second group assessed as different from the predefined logic state.

17. The memory device of claim 16, further comprising the memory controller configured to apply a recovery voltage higher than the reading voltage to assess the logic state thereof.

* * * * *